United States Patent
Van Buskirk et al.

(10) Patent No.: US 6,346,741 B1
(45) Date of Patent: Feb. 12, 2002

(54) COMPOSITIONS AND STRUCTURES FOR CHEMICAL MECHANICAL POLISHING OF FERAM CAPACITORS AND METHOD OF FABRICATING FERAM CAPACITORS USING SAME

(75) Inventors: Peter C. Van Buskirk, Newtown; Michael W. Russell, Norwalk; Steven M. Bilodeau, Oxford; Thomas H. Baum, New Fairfield, all of CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/200,499

(22) Filed: Nov. 25, 1998

Related U.S. Application Data (63) Continuation-in-part of application No. 08/975,366, filed on Nov. 20, 1997, now Pat. No. 5,976,928.

(51) Int. Cl.[7] .............................................. H01L 29/40
(52) U.S. Cl. ........................ 257/664; 257/787; 257/788
(58) Field of Search ................................. 257/664, 787, 257/788, 789, 790, 765, 771, 767; 438/688, 687

(56) References Cited

U.S. PATENT DOCUMENTS

| | | | |
|---|---|---|---|
| 5,363,550 A | 11/1994 | Aitken et al. | ............ 29/828 |
| 5,367,956 A | * 11/1994 | Fogle, Jr. | ............ 102/202.2 |
| 5,589,845 A | 12/1996 | Yandrofski et al. | ......... 505/210 |
| 5,976,928 A | 11/1999 | Kirlin et al. | ............ 438/240 |
| 6,030,866 A | * 2/2000 | Choi | ............ 438/253 |

FOREIGN PATENT DOCUMENTS

EP     0 843 359 A2     5/1998     ......... H01L/27/108

OTHER PUBLICATIONS

Wolf, S., Silicon Processing for the VLSI Era, vol. 2, Lattice Press, pp. 176–196, 1990.*

* cited by examiner

Primary Examiner—T. N. Quach
(74) Attorney, Agent, or Firm—Steven J. Hultquist; Robert A. McLauchlan; Margaret Chappuis (57) ABSTRACT

An integrated circuit structures formed by chemical mechanical polishing (CMP) process, which comprises a conductive pathway recessed in a dielectric substrate, wherein the conductive pathway comprises conductive transmission lines encapsulated in a transmission-enhancement material, and wherein the conductive pathway is filled sequentially by a first layer of the transmission-enhancement material followed by the conductive transmission line; a second layer of transmission-enhancement material encapsulating the conductive transmission line and contacting the first layer of the transmission-enhancement material, wherein the transmission-enhancement material is selected from the group consisting of high magnetic permeability material and high permittivity material. Such integrated circuit structure may comprise a device structure selected from the group consisting of capacitors, inductors, and resistors. Preferably, the transmission-enhancement material comprises MgMn ferrites, MgMnAl ferrites, barium strontium titanate, lead zirconium titanate, titanium oxide, tantalum oxide, etc.

17 Claims, 5 Drawing Sheets

COMPOSITIONS AND STRUCTURES FOR CHEMICAL MECHANICAL POLISHING OF FERAM CAPACITORS AND METHOD OF FABRICATING FERAM CAPACITORS USING SAME

CROSS-REFERENCE TO RELATED APPLICATION

This is a continuation-in-part of U.S. patent application Ser. No. 08/975,366 filed Nov. 20, 1997 in the names of Peter C. Van Buskirk and Peter S. Kirlin for "Chemical Mechanical Polishing of FeRAM Capacitors", issued as U.S. Pat. No. 5,976,928 on Nov. 2, 1999.

BACKGROUND OF THE INVENTION

1. Field of the Invention

The present invention relates to a chemical mechanical polishing (CMP) method and composition having applicability to the manufacture of ferroelectric random access memory capacitors, in which a stop layer is employed over the capacitor recess dielectric material to achieve the required planarization of the microelectronic device structure. It is also applicable to the fabrication of other integrated circuit structures, such as capacitor, resistor and inductor structures, which in utilizing multilayer geometries benefit from the inherently planarizing character of CMP.

2. Description of the Related Art

There is currently a major effort in semiconductor companies, worldwide, to commercialize high dielectric constant and ferroelectric thin films in advanced DRAMs and ferroelectric random access memories (FeRAMs), respectively. These material s include $BaSrTiO_3$ (BST) for DRAMs and $PbZrTiO_3$ (PZT) and $SrBi_2Ta_2O_9$ (SBT) for FeRAMs.

It is well known that these materials require electrodes made from noble metals or noble metal alloys such as Pt, Ir, $IrO_2$, Pt—Ru, etc., and sub-micron patterning of both the noble metals and the ferroelectric films is very difficult because of the absence of volatile products for the elemental constituents. State-of-the-art dry etching processes for Pt and Ir are known to have fundamental difficulties due to the predominantly physical (not chemical) mechanism for material removal, resulting in formation of unwanted structures (sometimes called "ears") at the edges of the electrodes.

Besides the difficulties in patterning sub-micron capacitors of this type, for high memory density it is also important to fabricate the capacitors directly over a conductive plug to contact transistors in order to reduce the area of the memory cell. This geometry (capacitor over plug) is also known as a stack capacitor configuration. For the conventionally employed materials, e.g., polysilicon or tungsten for the plug, a barrier layer is needed to prevent oxidation of the plug and diffusion of the plug material (p-Si or W) through the noble metal bottom electrode. To overcome such problems, it is desirable to use geometric means to protect the plug/barrier/electrode interfaces from exposure to oxidation.

At present, physical vapor deposition methods and stack capacitor configurations are predominantly used for the fabrication of DRAM and FeRAM microelectronic device structures.

An alternative to the stack capacitor is a trench capacitor, which utilizes an enhanced surface area capacitor on the walls of a trench that is etched directly into doped silicon. In such trench capacitors, the bottom electrode contact is not to a conductive plug (p-Si or W) but to the conductive substrate itself, though the requirements for the barrier are similar to the stack configuration. In trench capacitor architecture, the memory cell's transistors are formed on the surface of wafer adjacent to the top of the trench capacitor.

Ferroelectric capacitors planarized using chemical mechanical polishing are also more versatile for monolithic integration of ferroelectric memory or dynamic random access memory (DRAM) with logic IC ("embedded memory"). The 4–6 levels of metal needed for logic ICs place additional demands on the planarity of the underlying structures. Surface flatness is required in high resolution microlithography in order to stay within the aligner's specified depth of focus.

A variety of semiconductor integrated circuits utilize passive (and in some cases active) filtering techniques that use resistors, capacitors, inductors. There is an accelerating trend toward the incorporation of multiple circuit functions in a single IC, whereas in the past different IC's were fabricated and connected externally on a circuit board, or by another packaging scheme.

Given the economic and performance advantages of monolithic integration of these functions, it is highly desirable to fabricate compact RLC elements directly on the chip during fabrication of the other parts of the IC. It is essential to minimize the number of processing steps as much as possible, and to achieve the highest possible yield for IC devices that are manufactured.

By way of background to the ensuing description of the present invention, a description is set out below of machines used in conventional CMP process operations, polishing pads and slurry compositions used in chemical mechanical polishing.

Three types of mechanical, rotating actions are typically employed in conventional CMP machines. One such type has a rotating wafer carrier. Another revolves the abrasive pad. A third type spins both the wafer carrier and the abrasive pad simultaneously. The polishing pad is pre-soaked and re-wet continuously with a slurry consisting of various particles suspended in a solution. The polishing particles range in size from 10 to 1000 nanometers. The suspension solution generally comprises a diluted base or acid for polishing oxide and metals, respectively. Upon completion of the planarization, the wafers go through a post-CMP clean process in which the residual slurry, ground oxide/metal particles, and other potential contaminants are removed. Most IC manufacturers use a combination of de-ionized (DI) water rinses and nitrogen air drying to accomplish the post-CMP decontamination.

The two most common uses of CMP are oxide and metal (tungsten) plug planarization. The two most essential components of the CMP process are the slurry and the polishing pad.

The polishing pad, generally a polyurethane-based material, performs two primary functions. The polymeric foam cell walls of the pad aid in removal of the reaction products at the wafer surface and the pores within the pad assist in supplying the slurry to the pad/wafer interface.

Progressively more research efforts have focused on further understanding empirical results of the intimate contact between the pad and the pre-planarization surface. Several peculiarities were originally noticed in the material removal rate (RR) as a function of time, pressure and velocity. Many CMP users noticed that the RR decreased tremendously as high throughput processes were attempted. Research showed that deformation of the pad resulted from the brittle, hard surfaces of the ICs structure. The asperity of the pads, or surface roughness due to the type of material, the density of the "pockets," and abrasive characteristics, was found to decline due to pad layer removal. To alleviate this problem, called "glazing," the pad was conditioned after an experimentally determined amount of time, or wafer runs. The conditioner was composed of a base material (metal), a diamond grit (for cutting), and a grit-bonding material (ni plating). The plating bonded the diamond grit to the base material. The conditioner then effectively removed the top layer of the pad until excess, non-desired particles were removed and the nominal surface characteristics of the pad were restored. Although this approach allowed the same pads to be used for an extended period of time, it also resulted in other complications.

Specifically, the physical bonding of the diamonds and base material ruptured relatively easily during the conditioning process. New methods of bonding as well as enhanced post-conditioning cleaning were pursued. When the diamonds were chemically bonded to the base material, the additional strength made grit detachment less prominent. The new bonding method allowed a factor of ten more wafers to be polished with the same conditioning pads as compared to the number that were able to be polished with the physically grit-bonded pads.

Pad conditioning plays a larger role in planarization of oxide than in planarization of metals since metals tend to have a higher degree of hardness relative to the pad material.

To aid in transporting the slurry to the pad/wafer interface, new pad structures have been designed. Karaki-Doy and other developers have designed polishing pads with continuous grooves in concentric ellipses across the entire pad. This structure was found to deliver the slurry more uniformly to the interface and to augment the amount of debris removal resulting from the CMP process. Most conventional pads consist of "pockets" within the polyurethane which are prone to clogging due to the residual debris discharged during the process. Consequently, Karaki-Doy and other developers placed the grooves in the surface of the pad, and noticed an increased longevity in the conditioning-to-conditioning life of their pads over common types of pads.

Another key element in the amenability of the pad to planarize uniformly is the IC device density and relative layer heights (critical dimensions, CD) of the structure undergoing CMP. CMP tends to polish small, individual features faster than larger, more densely packed features. The oxide removal rate over features 15 microns in width is 60–80% greater than the oxide removal rate over features 60 microns in width. Denser or larger features tend to distribute applied load pressure over a larger area than smaller features. Since the removal rate and pressure are directly related in the direct contact mode, the removal rate decreases since the effective, local pressure decreases. The same principles apply when adjacent layers have a larger height contrast. "Taller" features will be planarized quicker, depending on other dimensions and the proximity to other devices.

The foregoing factors add complexity to IC design. If IC manufacturing processes will utilize CMP processing, device dimensions and density are critical and require close scrutiny.

The slurry composition used in CMP comprises abrasive particles suspended in a solvent, or solution. Key factors in the effectiveness of the slurry include particle size and shape, solution pH, weight percent solids of the slurry, the quantity of the slurry delivered, and the reaction time involved.

The purpose of the slurry is simple, yet understanding and modeling all the mechanical and chemical reactions involved is extremely difficult. Essentially, the surface of the material being polished is chemically altered to a softer composition, which is then mechanically removed by the pad and slurry abrasives. Thus, the slurry provides both chemical and mechanical forces in the CMP process. Oxide slurries are relatively new and largely experimental, yet the most common are ferric nitrate with an alumina abrasive and low pH. Some polysilicon and polyimide slurries exist, but are still in the prototype and developmental stages.

To date, most of the research devoted to development of slurry compositions has focused on oxide slurries instead of being directed to metal slurries. Due to the numerous desirable characteristics of tungsten plugs, more attention is being directed to development of selective metal slurries. IBM has developed metal slurries with a tungsten:oxide selectivity of 120:1. This type of planarization is essential to the fabrication of multilevel metals and interlevel connects. Ideally the slurries investigated will produce high removal rates, high selectivity, local uniformity, and good planarity. Since "perfect" slurries do not currently exist, inevitable trade-offs have been made in evolving acceptable commercial slurry formulations.

Due to the chemical nature of CMP, various studies have evaluated the influence of differing amounts of slurry introduced at the wafer/pad interface. In the case of oxide slurries, it is believed that the water in the solution reacts with the silicon oxide in the reaction as follows:

$$(-Si-O-Si-)+H_2O \rightarrow 2(-Si-OH)$$

Since water has a low diffusivity in silicon oxide, the reaction occurs primarily at the oxide interface under applied load as the abrasive particle moves across the surface. Water diffusion into the oxide results in the breaking of (network-forming) Si—O bonds and the formation of Si—OH. Once all of the Si—O bonds for a given Si atom are hydrated, $Si(OH)_4$ is formed which is soluble in water. Increasing the temperature directly increases the removal rate since the diffusivity of the water rises (specifically the diffusion constant of water in oxide). The most effective pH levels for oxide planarization lie between 9.7 and 11.4.

In the case of metal slurries, the composition is even more critical. Typical slurries incorporate an oxidizer or naturally dissolved oxygen additives to adjust pH levels, and either alumina or colloidal silica abrasives. The oxidizer changes the oxidation state of the metal and consequently produces metal ions. The top oxidized metal layer is more brittle and easily removed with the embedded abrasive particles. If the oxidation potential is too aggressive or the resulting metal compound too soluble, metal corrosion can occur as a result of wet etching. Alloys, galvanic actions, and precise oxidation states (oxidizers) are employed to slow down wet etching and limit the metal corrosion.

Two other key issues relating to the choice of slurry deal with post-CMP clean-up and the introduction of mobile ions to the wafer. Depending on the chemical reaction, oxide slurries can introduce various contaminants to the wafer surface. In terms of particle sizes, KOH-based slurries introduce a larger quantity of 200 nanometer particles than do the $NH_4OH$ slurries. That difference translates into a higher probability of scratches (e.g., up to 7 times greater, according to some studies) on the wafer surface when using the KOH slurries. $NH_4OH$ slurries also produce a lower concentration of mobile ions than KOH-based slurries, and leave residual films that are easier to remove than the residue from KOH slurries. Environmentally, however, KOH-based slurries afford advantages over $NH_4OH$ slurries. No ammonia smell exists when using KOH slurries, KOH slurries are less prone to settle in cleaning tanks and CMP machines, and KOH slurries are more stable in terms of pH, and less temperature dependent than $NH_4OH$ slurries.

Although CMP has revolutionized global planarization technology, some significant problems exist. One of the major difficulties is in-situ measuring of the amount of material removed from the wafer surface. Due to inaccurate models, many results of CMP machines are difficult to reproduce and the machines themselves do not exhibit the ability for precise process control. This also leads to difficulty in analyzing feedback, or using in-situ measurements, to make adequate and appropriate process alterations to alleviate process complications. Some CMP slurry analyzers have been designed to measure and detect particle sizes in order to ascertain the abrasive characteristics of slurries more accurately. A few endpoint detection devices, like a stylus profiler, have been developed to monitor removal rates as well. Such efforts will aid in more precisely controlling the entire CMP process, but the analysis techniques and instruments have not been developed to a state of high commercial precision.

Thus, commercial CMP is the focus of substantial development effort, but in essence it continues to comprise the simple unit operations of:

1. reaction of an exposed layer of material (e.g., an insulating inorganic metal oxide and/or noble metal) to produce a wafer-adhered material whose hardness is less than the hardness of the abrasive and whose adhesion to the substrate is less than the original pre-reaction layer; and
2. removal from the substrate of the aforementioned reaction product material using a polishing slurry (abrasive medium).

Illustrative CMP slurry compositions (by principal reaction type) for insulating inorganic metal oxides include the compositions set out below:

A. Acidic or Basic Aqueous Solution:

| | |
|---|---|
| HCl, $H_2SO_4$ | 0.01 M or greater |
| KOH, NaOH, $NH_4OH$ | 0.01 M or greater |

The art has directed improvements to alkali-containing solutions via aqueous or alcohol solutions of fluorinated silicon oxide particles, specifically the use of $H_2SiF_6$.

The abrasive composition comprises $Al_2O_3$ and/or $SiO_2$ aqueous solution.

B. Oxidizing Agent (with reduction potential, $E_0$, greater than IV):

| | |
|---|---|
| $H_2O_2$ | 35 vol. % or greater |
| nitrates, chromates, permanganates, $O_3$ and $F_2$ | |

The abrasive composition comprises $Al_2O_3$ and/or $SiO_2$ aqueous solution.

C. Halogenated or Pseudohalogenated Material (in inert atmosphere):

| | |
|---|---|
| $POCl_3$, $SOCl_2$ | 100% or combined with a dry solvent (solvents, toluene, ethers, ketones, DMSO, etc.) |
| $P(SCN)_3$, $(SCN)_2$, $S(SCN)_2$, $Hg(NCS)_2$, $Hg(NCO)_2$, $AgNCO$, $CH_3NCO$, $C_6H_5NCO$, BrCN | 20–100 vol. % |

The abrasive composition comprises $Al_2O_3$ and/or $SiO_2$ aqueous solution.

The slurry comprises a non-aqueous halogenated or pseudohalogenated reactant, and preferably includes a liquid organic ligand precursor (e.g., cyclic, acyclic, polycyclic, or aromatic compounds) which upon reaction with the halogenated or pseudohalogenated material form a metal-organic coordination complex which is heterocyclic.

The occurrence of dishing or polishing flaws, particularly with the CMP of soft metals such as Al, Cu or Ag, have been mediated in part by storage/delivery of a polishing agent slurry at reduced temperatures where flocculation or precipitation of the slurry is minimized. In addition, agitation of the polishing media (to inhibit flocculation), as well as temperature and velocity control of the polishing wheel has been shown to improve CMP homogeneity.

The CMP pad wears at an exponential rate during its initial use and then wears linearly with time. Further, the CMP pad does not remove material uniformly as the pad wears. These factors make it difficult to maintain an acceptable removal rate and uniformity in the CMP operation.

The art continues to seek improvements in the CMP process and in the fabrication of ferroelectic devices such as FeRAMs.

Individual spatial dimensions of the top electrode/ferroelectric material/bottom electrode (TE/FE/BE) capacitor in a typical FeRAM are on the order of 100 nm. In order to minimize damage/inhomogeneity during the CMP of this layered structure, the maximum abrasive particle size should be much less than the minimum feature size in the device.

Obstacles facing the commercial use of CMP for ferroelectric-based capacitors with noble metal electrodes include the relatively low chemical reactivity of many noble metals of interest, and the high degree of hardness of various of those metals, especially Ir and Rh. A large degree of mechanical removal of the noble metals and oxide films is necessary to achieve high removal rates, and the CMP process may result in physical or chemical damage to the capacitor layers. Physical damage includes disruption of the microstructure and long range order of the polycrystalline oxide lattice, which is principally responsible for the unique properties of the ferroelectric and high $\epsilon$ oxides. Chemical damage, especially in the ferroelectric layer, may involve removal of specific cations, interdiffusion, de-oxygenation, or introduction of metallic contamination from the polishing media.

One difficulty in the use of CMP for planarization of FeRAM and high permittivity capacitor structures is the difficulty of accurately controlling the removal of oxide materials such as silicon dioxide ($SiO_2$). The ability to control the oxide removal in an accurate and reproducible manner thus would be a significant advance in the art, and would enable more robust CMP processes to be utilized in commercial manufacturing operations.

In contrast to planarization of $SiO_2$ using CMP, planarization of FeRAM or high $\epsilon$ capacitor structures entails CMP definition of the edge of the ferroelectric or high $\epsilon$ layer, where relatively high E-fields are realized in these capacitor applications. Damage to the ferroelectric or metal layers will therefore have large effects on the functionality of the capacitor.

It would therefore be a significant advance in the art, and is one object of the present invention, to provide a method and composition for chemical mechanical polishing that is usefully employed to achieve high rate removals of material while incurring only low levels of physical or chemical damage to the elements of the microelectronic structure undergoing CMP.

Another objective of the invention includes the provision of CMP compositions and methods that are usefully employed in capacitor fabrication, such as stack or trench capacitors including high dielectric or ferroelectric thin films, particularly where metals such as Pt, Ir, Rh, and the like are used for electrode elements in the structure.

Additional objects and advantages of the invention will be more apparent from the ensuing disclosure and appended claims.

SUMMARY OF THE INVENTION

The present invention utilizes chemical mechanical polishing for planarization of microelectronic device structures.

The chemical mechanical polishing composition and method of the invention in a preferred aspect are used to delineate ferroelectric or high permittivity capacitors. Such capacitors may be of any suitable type including trench and stack capacitor structures.

The invention facilitates fabrication of microelectronic device capacitor structures in geometries that are only limited by the resolution of the lithography and the conformality of thin film deposition processes. Therefore, the polishing of 0.18 or even 0.12 $\mu$m structures is possible without dry etching the noble metals or the thin film capacitor (high dielectric constant material layer or ferroelectric layer). Trench capacitors of this type possess the advantage of having significant contribution of sidewall area, without the need for separate patterning steps for the top and bottom electrode, thus the method of the invention has large economic advantages. Additionally, the approach of the present invention has inherent advantages to protect the plug-barrier-bottom electrode interface from exposure to oxidation.

In one aspect, the present invention relates to a method of forming a microelectronic device structure. Such method includes the steps of forming a capacitor recess dielectric material, depositing a bottom electrode layer, a ferroelectric layer, and a top electrode layer, to form a capacitor precursor structure. This capacitor precursor structure then is planarized by chemical mechanical polishing to yield the ferroelectric capacitor structure, e.g., a stack capacitor or a trench capacitor. One improvement of the invention involves forming the capacitor recess dielectric material to contain a stop layer at the planarization depth, wherein the stop layer has a substantially lower CMP removal rate than the dielectric insulating material and device structure materials under CMP conditions. In this manner, the removal of the dielectric insulating material and device structure materials by CMF under CMP conditions is terminated at the planarization depth by the stop layer.

In addition to the small feature sizes mentioned above, the invention will also find utility in fabrication of larger capacitor structures that do not require increased capacitor area, because of the simplicity of material removal compared to wet or dry etch techniques.

The method of the invention may comprise chemical mechanical polishing of a microelectronic device structure for planarization thereof, wherein:

(I) the CMP medium contains at least one component that is a beneficial dopant, modifier or other additive of the ferroelectric or high $\epsilon$ film being removed in the CMP operation (examples include perovskite nanocrystalline particles, such as those of barium strontium titanate; tantalum oxide, niobium oxide, or other donor dopants compensatory for O vacancies or acceptor impurity defects in the thin film capacitor material when incorporated therein; refractory nitrides and carbides including cations that are beneficial to dielectric and/or ferroelectric properties of thin film capacitor material when incorporated therein, such as tantalum nitride, tantalum carbide, niobium nitride, and niobium carbide; components that have hardness exceeding hardness of chemical byproducts existing at surface of the film being planarized; and reactant components that react with the material at the surface of the film being planarized, such as acids, bases and components that are effective to oxidize the material at the surface of the film being planarized);

(II) metal (electrode material) or dielectric (ferroelectric or high dielectric constant) material is removed either during or after the CMP planarization to create a local recess in the substrate, optionally followed by deposition of an insulating layer thereover, to thereby reduce the susceptibility of the device structure to short-circuiting or high leakage current behavior in use, with such metal removal comprising at least one of the steps of:

inert ion bombardment of the device structure after CMP planarization and before deposition of an interlayer dielectric material (e.g., Pb diffusion barrier layer for PZT device structures, Bi diffusion barrier layer for SBT device structures, and $SiO_2$ diffusion barrier layer for BST device structures); and isotropic dry etching of the device structure;

(III) physical damage to the device structure crystalline lattice structure is removed by thermal annealing of the device structure after CMP planarization (e.g., by conventional oven processing, or by rapid thermal annealing (RTA), preferably conducting such thermal annealing in the presence of oxygen to facilitate correction of oxygen stoichiometry in the thin film capacitor material and/or other device structure oxide layers;

(IV) noble metal electrode material is removed by a CMP composition comprising component(s) selected from the group consisting of:

silica, alumina, titania, silicon carbide, diamond, ceria, perovskite nanocrystalline particles, dopant materials of the above-described types, and mixtures of the foregoing; and components reactive with the noble metal electrode material to form solid and/or ionic products having a lower hardness than the noble metal electrode material itself (e.g., nitrides, sulfides, halides, oxides, hydrated oxides, etc. of the noble metal), such reactive components including species such as $H_2O_2$, $K_3Fe(CN)_6$, $K_3Fe(C_2O_4)_3$, $Fe(C_2H_3O_2)_3$, $Fe(NO_3)_3$, $Fe_2(SO_4)_3$, $Fe(OH)_3$, $(NH_4)_3Fe(CN)_6$, $(NH_4)_3Fe(C_2O_4)_3$, KCl, KBr, KI, $FeCl_3$, $FeBr_3$, $FeI_3$, $FeCl_2$, $FeBr_2$, and $FeI_2$.

In a further aspect of the method of the invention, wherein the metal electrode material is being removed, a high selectivity between metal polishing and oxide polishing is achieved by conducting the CMP operation in accordance with the relationship:

$$(\text{pressure} \times \text{platen speed}) < 300 \text{ psi rpm}$$

wherein the pressure is measured in pounds per square inch, and the platen speed of the CMP polishing pad is measured in revolutions per minute.

Still another aspect of the invention relates to a method of fabricating an integrated circuit structure including conductive transmission lines, comprising:

depositing a dielectric material as a component of the structure, and providing pathways therein for the conductive transmission lines, depositing a transmission-enhancement material in the pathways, depositing conductor material for the conductive transmission lines on the transmission-enhancement material, subjecting the structure to chemical mechanical polishing for planarization thereof to define a desired geometry of conductive transmission lines of the conductor material, and depositing the transmission-enhancement material over the conductive transmission lines of the conductor material, to encapsulate the conductive transmission lines in the transmission-enhancement material, whereby the transmission-enhancement material enhances the inductance and/or capacitance of the conductive transmission lines, relative to a corresponding integrated circuit structure lacking such transmission-enhancement material.

A still further aspect of the invention relates to an integrated circuit structure including conductive transmission lines encapsulated in a transmission-enhancement material selected from the group consisting of high magnetic permeability materials (e.g., MgMn ferrites and/or MgMnAl ferrites) and high permittivity materials (e.g., barium strontium titanate, lead zirconium titanate, titanium oxide, tantalum oxide, etc.).

Other aspects, features and embodiments of the invention will be more fully apparent from the ensuing disclosure and appended claims.

DETAILED DESCRIPTION OF THE INVENTION, AND PREFERRED EMBODIMENTS THEREOF

The disclosure of U.S. patent application No. 08/975,366 filed Nov. 20, 1997 in the names of Peter C. Van Buskirk and Peter S. Kirlin for "Chemical Mechanical Polishing of FeRAM Capacitors" and issued as U.S. Pat. No. 5,976,928 on Nov. 2, 1999, hereby is incorporated herein by reference in its entirety.

The method of the present invention permits the formation of a microelectronic device structure including forming a capacitor recess dielectric material and device structure materials on a substrate, in which the device structure materials are removed during processing to a planarization depth therein by chemical mechanical polishing (CMP). In accordance with the invention, the capacitor recess dielectric material is formed to contain a stop layer at the desired planarization depth in the dielectric insulating material. The stop layer has a substantially lower CMP removal rate than the dielectric insulating material under CM, conditions, so that the removal of the device structure materials and dielectric insulating layer material by CMP under CMP conditions is terminated at the planarization depth by the stop layer.

The capacitor recess dielectric in such method may include a material species such as $Al_2O_3$, $Ta_2O_5$, $ZrO_2$, $TiO_2$, $SiO_2$, $Si_3N_4$, $TiAlO_4$, boron-doped $SiO_2$, or phosphorus-doped $SiO_2$, mixtures of those materials, etc.

The device structure materials may include one or more materials such as multicomponent oxide capacitive materials, ferroelectric materials, noble metals, noble metal alloys, polysilicon, tungsten, titanium nitride, titanium silicon nitride, titanium aluminum nitride, silicon carbide, and/or multicomponent oxide magnetoresistive materials.

By way of specific example, the device structure may comprise a ferroelectric material such as lead zirconium titanate, strontium bismuth tantalate, bismuth titanate, etc.

The device structure alternatively may include a multi-component oxide capacitive material such as barium titanate, barium strontium titanate, etc., or a multicomponent oxide magnetoresistive material such as lanthanum calcium manganate.

The stop layer may be formed of a material such as $Al_2O_3$, $Si_3N_4$, TiN, TiSiN, TiAlN, $IrO_2$, SiC or combinations thereof. In one preferred embodiment, the dielectric insulating material comprises $SiO_2$ and the stop layer is formed of $Si_3N_4$. In an additional preferred embodiment, the electrode materials comprise Ir, the ferroelectric material is lead zirconate titanate, and the conductive barrier layer is TiAlN. In this example the conductive barrier layer may serve as a stop layer for the CMP process.

In the method of the invention, the ratio of the stop layer CMP removal rate to the dielectric insulating material CMP removal rate under said CMP conditions is suitably less than 0.20, and more preferably is less than 0.01.

The microelectronic device structure that is fabricated in the practice of the invention may be of any suitable type, and may for example comprise a ferroelectric capacitor structure formed by sequentially depositing a bottom electrode layer, a ferroelectric layer and a top electrode layer on a base structure including the substrate and the capacitor recess dielectric material, to form a capacitor precursor structure, and planarizing the capacitor precursor structure by CMP to yield said ferroelectric capacitor structure. The capacitor structure may comprise a stack capacitor or alternatively a trench capacitor.

The ferroelectric capacitor device fabrication method of the present invention is preferably carried out without dry etching of the electrode layers or dry etching of the ferroelectric layer, and is applicable to fabrication of ferroelectric capacitors having a feature size below 1.0 $\mu$m, e.g., between 0.10 and 0.20 $\mu$m.

In one embodiment of the invention, the device structure material may form a capacitor structure including a top electrode, a ferroelectric layer, and a bottom electrode, with the stop layer underlying the bottom electrode as a conductive barrier layer for the capacitor structure.

The CMP conditions applicable to the practice of the invention may include any suitable slurry compositions, pressure and temperature conditions, as will be readily determinable within the skill of the art and without undue experimentation. The CMP conditions may for example comprise mechanical polishing with a slurry including an oxide abrasive material, e.g., alumina and/or ceria, and chemical additives for removal of the top electrode layer, ferroelectric layer and bottom electrode layer in the case of a ferroelectric capacitor structure.

In accordance with the method of the present invention for fabrication of a ferroelectric capacitor microelectronic device structure, there are several approaches that obviate or prevent degraded capacitor performance due to damage to the ferroelectric and/or noble metal layers of the capacitor in consequence of the use of CMP for planarization. The different approaches can be categorized as: (a) preventing damage; (b) localizing damage to minimize its impact on capacitor function; and (c) healing damage. These approaches are each described in turn below.

In the approach (a) of preventing damage to the microelectronic device structure, the CMP operation may be carried out with polishing media containing elements that are used as dopants and/or modifiers in the film being removed, so that these components of the CMP composition become incorporated in the film left at the conclusion of CMP processing, and beneficially affect the residual film on the substrate, relative to the use of a CMP composition lacking such components therein.

For example, the polishing media may be formulated to contain perovskite nanocrystalline particles similar in composition to the film being removed, or including constituents that would have a positive effect on the dielectric material layer if the cations of the perovskite material were incorporated in the dielectric film material, either as dopants or modifiers. Such compounds may for example include $BaSrTiO_3$, and related materials, which contain species that are known to be beneficial to the properties of the many other perovskites when incorporated therein in small concentrations. An additional benefit of this approach is that the hardness of the perovskites are similar (i.e., the perovskite in the film being subjected to CMP processing, and the perovskite in the CMP composition), and removal of the perovskite film would only take place if it was chemically modified at its surface. The resulting process is therefore highly controllable in character, since chemical surface modification may be employed to achieve highly precise levels of material removal in the CMP operation.

Polishing media may be employed in the CMP operation, which are comprised of oxides such as $Ta_2O_5$, or $Nb_2O_5$. Incorporation of those metal elements improve the properties of many perovskite oxides, especially those in the PZT family, which are prone to O vacancies, which in turn result in degraded electrical properties. Donor dopants may be employed to compensate for O vacancies as well as defects due to acceptor impurities, so that the dopant species are incorporated in the film being subjected to CMP processing.

Refractory nitrides or carbides likewise may be employed in the CMP medium, which contain cations as described above. Examples include Ta nitride, Ta carbide, Nb nitride and Nb carbide.

The CMP medium may be formulated to have hardness exceeding the hardness of the chemical byproducts at the film surface of the material undergoing CMP, yet which will also "stop" at polish stop layers such as binary or ternary nitride-carbide barriers, as described in copending U.S. patent application Ser. No. 09/141,971 filed Aug. 28, 1998 in the names of Peter C. Van Buskirk and Michael W. Russell for "Ternary Nitride-Carbide Barrier Layers" and issued as U.S. Pat. No. 6,184,550 on Feb. 6, 2001, the disclosure of which hereby is incorporated herein by reference in its entirety.

Mixtures of the above-described CMP media with conventional slurries, including liquid media that are typically used to react at the thin film surface, as for example acids, bases and oxidizers, may be usefully employed in CMP compositions according to the present invention.

In the above-described approach (b) of localizing damage to the microelectronic device structure to minimize the impact on subsequent device function and operation, preferential removal of the metal or dielectric (ferroelectric or high $\epsilon$) layer may be carried out, either during or after the CMP step, to create a local recess. This approach removes the damaged area, or makes the presence of a damaged region irrelevant. In this case the possibility of electrical shorts or high leakage current in the areas affected will be reduced. Such an approach may be accomplished in a several ways.

In one technique, inert ion bombardment may be carried out after CMP is complete and before deposition of the interlayer dielectric (e.g., a Pb or Bi diffusion barrier for PZT and SBT; $SiO_2$ for BST). Bombardment will preferentially remove lighter elements such as Zr and Ti compared to Ir or Pt, for example, and residual Pb may be removed as PbO at elevated temperatures such as >600° C. The inert ions for such bombardment technique may be of any suitable type, which are non-reactive to the material being removed. Examples include argon, helium, xenon, etc.

As another technique, isotropic dry etching may be carried out, as more fully described in co-pending U.S. patent application no. U.S. patent application Ser. No. 09/093,291 filed Jun. 8, 1998 in the names of Peter C. Van Buskirk, Frank DiMeo, Jr., Peter S. Kirlin, and Thomas H. Baum for "ISOTROPIC DRY CLEANING PROCESS FOR NOBLE METAL INTEGRATED CIRCUIT STRUCTURES" and issued as U.S. Pat. No. 6,254,792 on Jul. 3, 2001, the disclosure of which hereby is incorporated herein by reference in its entirety.

In the alternative approach (c) of healing damage to the processed film that has been occasioned by the CMP operation, physical damage to the crystalline lattice may be removed by using a post-CMF thermal anneal. Such thermal anneal may be of any suitable type, and may for example comprise a conventional oven thermal anneal process or a rapid thermal anneal (RTA) process. This post-CMP anneal is typically and preferably performed in the presence of oxygen in order to allow oxygen stoichiometry to be corrected.

The present invention also contemplates the formulation of CMP slurry media to achieve significant removal rates of noble metals via chemical mechanical polishing. Suitable CMP slurry media for the polishing of iridium and other noble metals are more filly described in co-pending U.S. patent application Ser. No. 09/216,679 filed Dec. 18, 1998 in the names of Michael W. Russell, Peter C. Van Buskirk, Jonathan J. Wolk, and George T. Emond for "PROCESS FOR THE CMP REMOVAL OF IRIDIUM THIN FILMS," the disclosure of which hereby is incorporated herein by reference in its entirety.

Polishing media for noble metals may contain conventional abrasive particles such as silica, alumina, titania, silicon carbide, diamond, or ceria; perovskite nanocrystalline particles, or dopant metal particles of the type as described earlier hereinabove, or mixtures of two or more of the foregoing.

During metal CMP, the slurry chemicals react with the metal surface and form either solid and/or ionic products. Enhanced removal rate of the metal film is accomplished in instances where this surface layer is more easily removed by abrasion than the original metal surface. The surface layer may be a nitride, sulfide, halide, or combination thereof, but is most likely an oxide or hydrated oxide layer that is softer than the underlying noble metal film. Native oxide and hydroxide films may form in exposure to various CMP slurries depending upon the solution pH, electrochemical potential of the metal in the slurry environment, and the kinetics of the various reactions that are thermodynamically favorable for a given set of CMP processing conditions. Control of the solution pH and electrochemical potential via the use of buffering agents may be desirable in order to facilitate a balance between chemical etching and material removal by mechanical abrasion.

Chemical additions to the polishing media which promote the formation of a softer surface layer include $H_2O_2$, $K_3Fe(CN)_6$, $K_3Fe(C_2O_4)_3$, $Fe(C_2H_3O_2)_3$, $Fe(NO_3)_3$, $Fe_2(SO_4)_3$, $Fe(OH)_3$, $(NH_4)_3Fe(CN)_6$, $(NH_4)_3Fe(C_2O_4)_3$, KCl, KBr, KI, $FeCl_3$, $FeBr_3$, $FeI_3$, $FeCl_2$, $FeBr_2$, and $FeI_2$, and combinations of two or more of the foregoing, with the choice of a specific composition and softening agents being readily determinable without undue experimentation by those of ordinary skill in the art.

Based on the Preston equation for CMP, high selectivity between metal and oxide polishing may be achieved by conducting the CMP operation under conditions at which the parameter (pressure x platen speed) has a value of less than 300 psi rpm, wherein pressure of the CMP polishing pad is measured in psi, and the platen speed of the polishing pad is measured in rpm units.

While the invention is described more fully hereinafter primarily in relation to capacitor structures and their fabrication using the CMP methodology and CMP compositions of the invention, it will be recognized that the utility of the invention is not thus limited, but encompasses a wide variety of other microelectronic device structures, such as for example, integrated circuit structures such as capacitor, resistor and inductor structures, and other microelectronic device structures which utilize multilayer geometries.

Referring now to the drawings, the process flow for one embodiment of the invention as it applies to a stack capacitor is shown schematically in FIGS. 1A through 1H. The steps shown in the drawings for FIGS. 1A through 1H, are described below with reference to the following correspondingly identified sequence of process steps A through H.

Figure 1A:
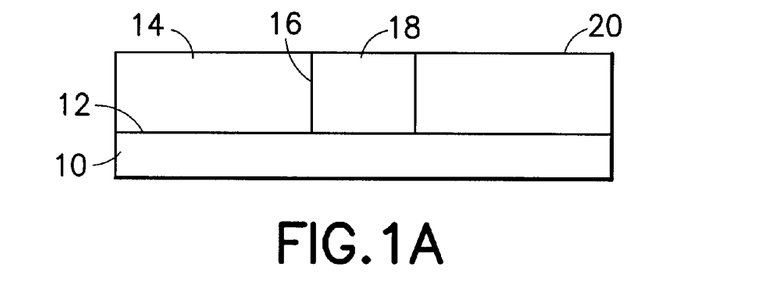
FIGS. 1A through 1H show a schematic process flow for patterning sub-micron ferroelectric capacitors in a stack capacitor configuration using CMP in accordance with the present invention, with CVD of the ferroelectric, electrode and barrier layers being desirable for feature sizes below 1 micron.
Figure 1B:
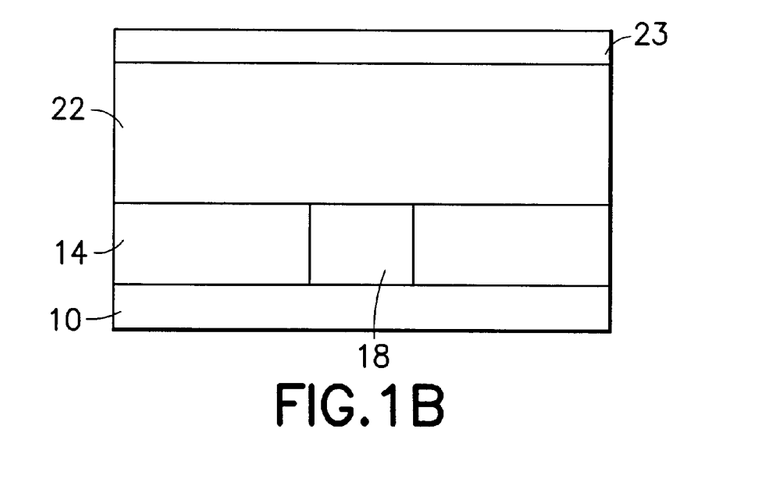
Figure 1C:
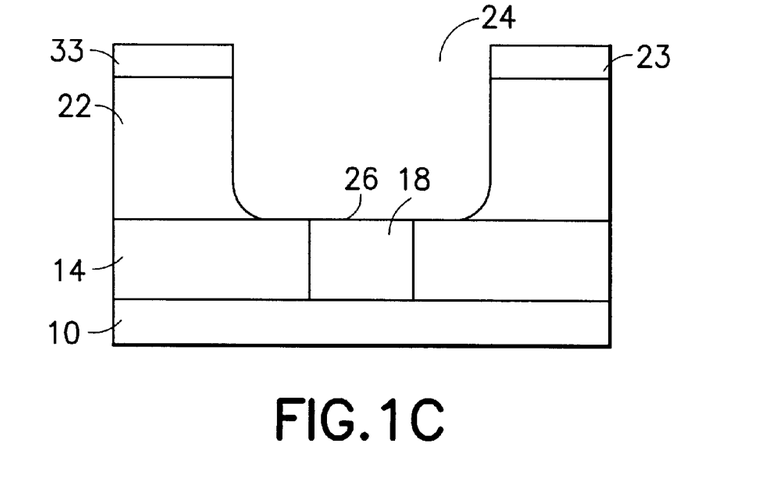

As shown in FIG. 1A (step A), a substrate 10 (typically formed of silicon, although other substrate materials of construction, such as GaAs, are possible) is provided with transistors and other circuitry (not shown) already fabricated below the wafer surface 12, according to conventional fabrication techniques. The silicon circuitry is covered with an insulating layer (isolation dielectric) 14 such as $TiO_2$, $SiO_2$, $Si_3N_4$, boron- or phosphorus-doped $SiO_2$, etc. Vias 16 to the Si circuitry are opened using photolithography and dry-etching, a plug 18 of suitable material, such as p-Si or W, is formed in the vias using CVD, and the surface 20 is planarized using dry etching or CMP.

In step B (FIG. 1B), a capacitor recess dielectric 22, of a material such as $TiO_2$, $SiO_2$, $Si_3N_4$, boron- or phosphorus-doped $SiO_2$, etc., is formed over the surface of the plugs 18 and isolation dielectric 14 using CVD, sputtering or wet deposition methods. In one embodiment the isolation layer and the capacitor recess dielectric may be fabricated from the same material.

In step C (FIG. 1C), capacitor recesses 24 are formed in the surface of the insulating layer 22 using photolithography and dry-etching. The top surface of the conductive plug 26 may then be sputter etched or heat treated to ensure a clean surface prior to conductive barrier deposition in step D.

Figure 1D:
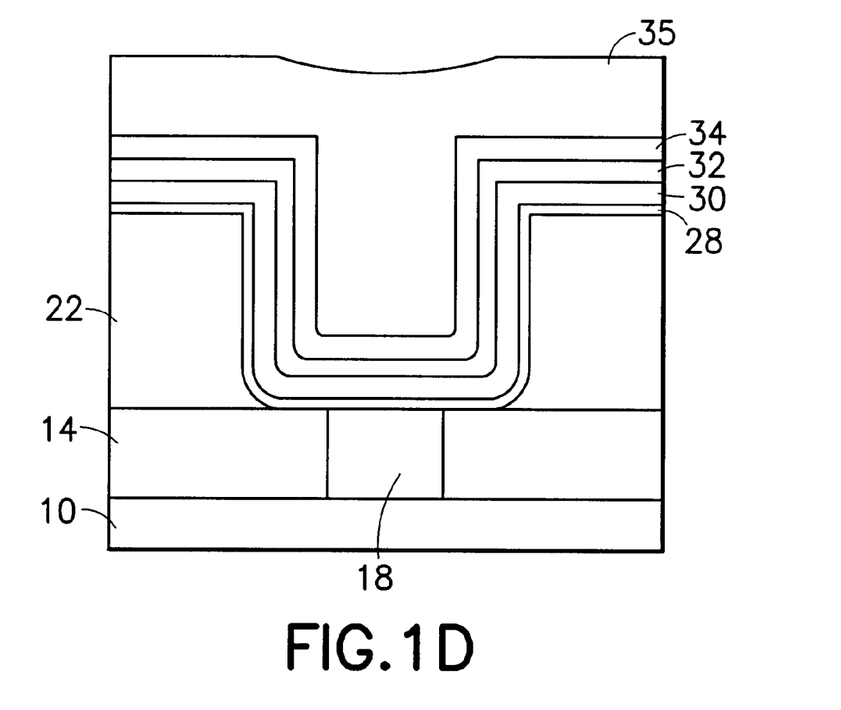

The conducting and insulating layers that will comprise the capacitor layers are deposited in step D (FIG. 1D). The layers include (in the sequence they would be deposited in): a conductive barrier layer 28, the bottom electrode 30 (BE), the ferroelectric layer 32 (FE), the top electrode 34 (TE), and the dielectric insulating layer 35. The conductive barrier layer may be TiN, TiSiN, TiAlN, $IrO_2$, SiC or some other material suitable to withstand oxidation and prevent diffusion of Si. The conductive barrier layer may also be comprised of a Ti layer that is first deposited to improve contact of the barrier to the plug. The BE and TE layers are typically noble metals such as Pt or Ir, or alloys of similar materials. In some instances, TE need not be a noble metal, since it does not need to withstand the highly oxidizing deposition environment. The FE layer material is typically PZT or SBT, but it may be bismuth titanate or some other ferroelectric thin film composition. Alternatively it may be a similar multicomponent oxide such as BST for high capacitance, or $LaCaMnO_3$ for magnetoresistance, etc.

Figure 1E:
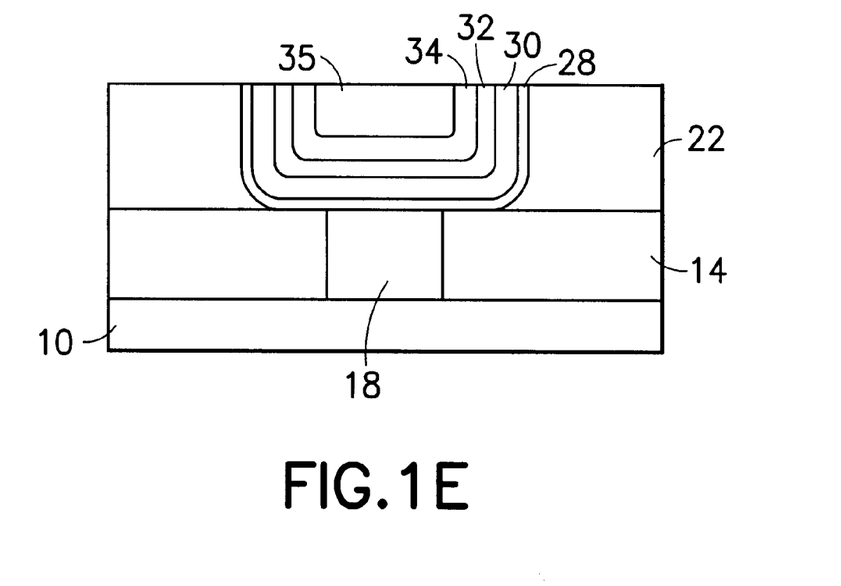
Figure 1F:
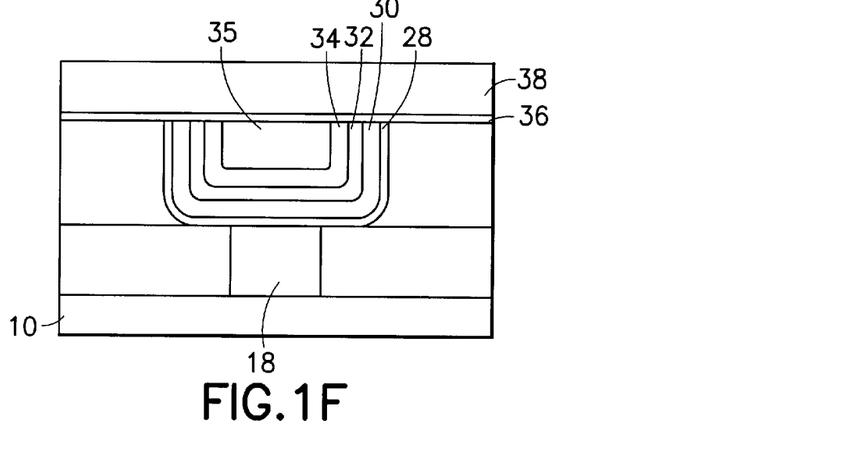
Figure 1G:
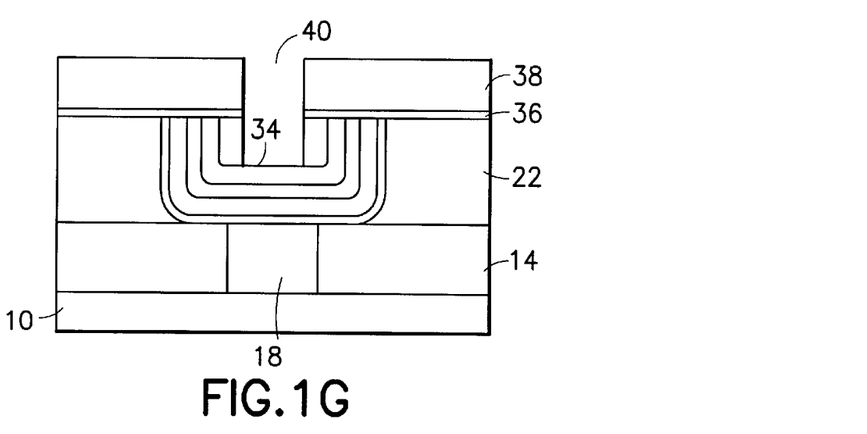
Figure 1H:
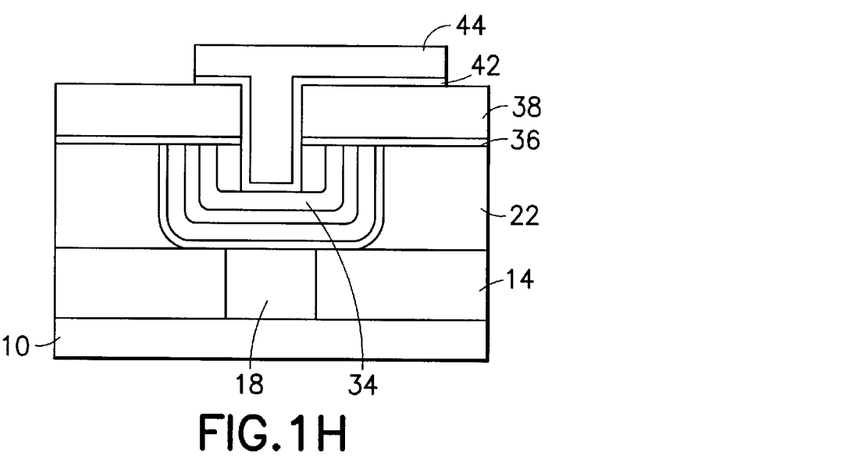

It is evident that some sidewall coverage of these layers is necessary and the different layers require sidewall coverage for different reasons. The barrier must cover the sidewall in order to make good adhesion between the BE and the capacitor recess dielectric, because excellent mechanical robustness is needed for the polishing in step E. The BE must cover the sidewall to achieve adequate thickness for electrical continuity if the sidewall part of the structure is to be used for the chosen application. Another constraint is that both the conductive barrier and the BE will together serve as a Pb or Bi diffusion barrier when $PbZrTiO_3$ or $SrBi_2Ta_2O_9$ are the dielectrics, and that function also requires adequate sidewall coverage of those layers. The dielectric must have adequate sidewall coverage to obtain uniform electrical properties in the capacitor, and to prevent short-circuiting between the TE and BE. For geometries >0.5 $\mu$m, the conductive layers can be deposited using sputtering, which results in adequate sidewall coverage. For smaller geometries or high aspect ratios in the capacitor recess, CVD of the conductive layers may be needed. CVD of the FE layer will generally be needed to prevent shorting between the TE and BE, although there may be cases where the FE can be sputtered with satisfactory results.

Next, in step E (FIG. 1E), the film stack is planarized using CMP which forms the 3 dimensional capacitors in the capacitor recesses. The CMP process is comprised of mechanical polishing with a slurry that typically contains an oxide abrasive harder than the materials being removed, such as alumina, ceria, etc., with chemical additives present to promote selective removal of the dielectric insulating layer, TE, FE, BE and barrier, relative to the capacitor recess dielectric.

In this step it is desirable to have a low selectivity between the conductive electrode metals, ferroelectric and barrier films (e.g., 1:1) and a high selectivity between the conductive electrode metals and capacitor recess dielectric 22 (e.g., >5:1). This selectivity will effectively stop the CMP process without requiring an excessively large thickness of the stop layer.

A preferred embodiment is to utilize a CMP process having a high selectivity between the electrode metal and the barrier layer, thereby using the barrier layer 28 as an intrinsic stop layer for the CMP process.

Alternatively, a conductive or an insulating stop layer 23 other than the barrier layer can be formed on the surface of the capacitor recess dielectric prior to fabrication of the capacitor recesses and utilized to terminate the CMP process in a similar manner.

When a conductive stop layer or conductive barrier layer is used to terminate the CMP process, the portion of this layer which lies outside of the capacitor recesses is removed or oxidized to render it insulating prior to the subsequent deposition of the insulating passivation layer which occurs in the next step. The removal of the barrier layer can then be carried out by dry etching, a process that is understood in the art and may be usefully employed for barrier layer materials such as TiN, TiAN or $IrO_2$.

A third alternative is to fabricate the entire capacitor recess dielectric of a suitable CMP stop layer material, and in that way there will be thickness of the stop layer even in cases where the selectivity of the CMP process is low with respect to the stop layer removal rate.

It may be required to sequentially apply two or more separate CMP processes (or slurries) for removal of the different materials in the capacitor, i.e., Ir may require a different CMP process than PZT, for example. Using an alumina-based slurry, Ir removal rates between 20–50 nm/min. have been demonstrated. Most CMP processes utilize a second stage polish that removes microscratches and/or corrosion product(s) that are present on the wafer surface. A post-CMP anneal in an oxidizing or inert environment may be carried out if required to remove physical or chemical damage to the ferroelectric film that was subjected to mechanical and chemical agitation during its partial removal by CMP.

Passive endpoint detection (utilization of high selectivity interfaces) is easily integratable and is preferred over the use of expensive metrology equipment.

Step F (FIG. 1F) involves sequentially depositing an insulating passivation layer 36 and an interlevel dielectric (ILD) 38 over the capacitors that were formed in the previous step. This barrier is deposited using CVD, sputtering or wet deposition methods, and its purpose is to prevent undesirable chemical reactions and interdiffusion between the top edge of the ferroelectric film or electrodes and the overlying ILD layer that typically contains Si or $SiO_2$. PZT and SBT in particular contain the highly chemically reactive and mobile species of Pb and Bi respectively, and it is important to prevent interdiffusion of those or similar species with the ILD layer. The passivation layer may be $TiO_2$, $ZrO_2$, $Ta_2O_5$, $Si_3N_4$ or other similar dielectric materials that include mixtures of those materials too. The ILD is $TiO_2$, $SiO_2$, $Si_3N_4$, boron- or phosphorus-doped $SiO_2$, etc., and is deposited using CVD, sputtering or wet deposition methods.

In step G (FIG. 1G) vias 40 are opened in the barrier layer and ILD using photolithography and dry-etching.

Finally, in step H (FIG. 1H), a diffusion barrier 42 of a material such as TiN, TiAlN, WN or other suitable material is deposited using CVD or sputtering, and metallization 44 is deposited over that barrier, in order to conformally fill the via. The metallization may be either CVD-applied W or Al that is sputtered at high temperatures or reflowed, or Cu, or Al—Cu alloys, or other conductive materials. The metallization is then patterned using photolithography and dry-etching.

In the FIGS. 1A–1H process flow for patterning sub-micron ferroelectric capacitors in a stack capacitor configuration, using CMP, chemical vapor deposition (CVD) of the ferroelectric, electrode and barrier layers is desirably employed for feature sizes below 0.35 μm.

As another example of a process flow in which the CMP methodology of the invention may be usefully employed, the fabrication of a trench capacitor is described below.

A substrate is utilized that may for example be formed of silicon, although other materials such as GaAs are potentially usefully employed, with transistors and other circuitry fabricated in the wafer surface. Alternatively, the substrate may be p-type, with no transistors fabricated in it at the time of capacitor formation.

Capacitor recesses are formed in the surface of the Si using photolithography and dry-etching.

Next, the conducting and insulating layers that will comprise the capacitor layers are deposited. The layers include (in the sequence in which they are deposited): a conductive barrier layer, a bottom electrode (BE), a ferroelectric layer (FE), and a top electrode (TE) layer. The barrier layer may be formed of TiN, TiSiN, TiAlN, $IrO_2$, SiC or some other material suitable to withstand oxidation and to prevent diffusion of Si. The BE and TE layers are typically formed of noble metals such as Pt or Ir, or alloys of similar materials. The TE layer need not be formed of a noble metal, since such layer does not need to withstand the highly oxidizing deposition environment. The FE layer is typically formed of PZT or SBT, but it may be alternatively formed of bismuth titanate or some other ferroelectric thin film material. Sidewall coverage issues are similar to those described above in the illustrative stack capacitor process flow, and the high aspect ratio (depth/width) of trenches in the Si substrate makes CVD highly preferred for fabricating all the capacitor-forming layers.

The film stack is planarized using CMP to form the three-dimensional capacitors in the capacitor recesses. The CMP process is conducted in accordance with the present invention and may utilize a slurry that typically contains an oxide abrasive harder than the materials being removed, such as alumina, ceria, etc., with chemical additives present to promote selective removal of the TE, FE, BE, and barrier layer relative to the silicon. It may be required to sequentially apply more than one CMF process, and to post-anneal the capacitor structure in an oxidizing environment, as described hereinabove.

Next, an insulating passivation layer and an inter-level dielectric (ILD) layer are sequentially deposited over the capacitors formed in the previous step.

Vias then are opened in the barrier comprising the insulating passivation layer and ILD layer using photolithography and dry-etching. A diffusion barrier layer of a material such as TiN, TiAlN, WN or another suitable material is deposited using CVD or sputtering The barrier layer deposited previously is patterned using dry etching or CMP.

Vias are opened to doped regions formed previously and p-Si or other suitable conductor is deposited and patterned to form part of the circuitry for the memory cell. Dielectric isolation material is then formed over the patterned p-Si word lines and plate, vias are opened to the transfer transistor (doped Si regions) and the bit line is formed by deposition and patterning of Al with suitable barrier layers at the Si interface.

In the above-described method for forming sub-micron ferroelectric capacitors in a trench capacitor configuration using CMP, it is preferred to utilize CVD to form the ferroelectric, electrode and barrier layers, when feature sizes below 0.35 μm or high aspect ratios are desired.

Figure 2A:
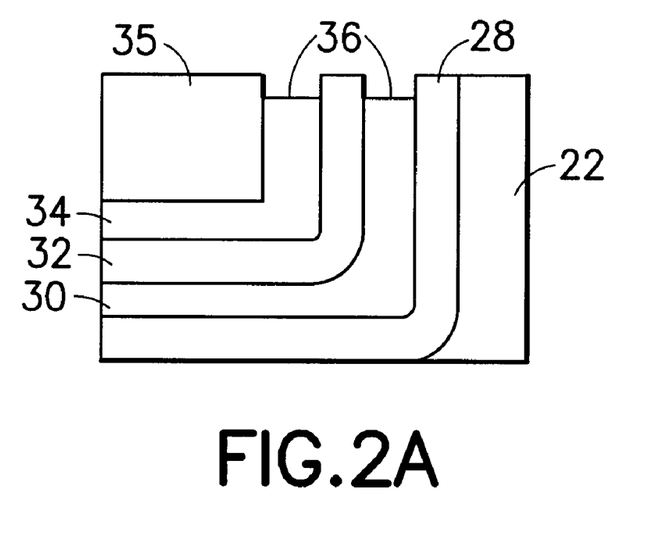
FIGS. 2A–2B show a schematic representation of a top edge region of the capacitor structure of FIG. 1E, showing the details of the structure.

FIG. 2A shows a magnified view of the device structure of FIG. 1E after CMP has been carried out. The CMP operation may result in the recessing of electrode layer edges forming the recess gaps 36 in relation to the otherwise planarized surface.

Figure 2B:
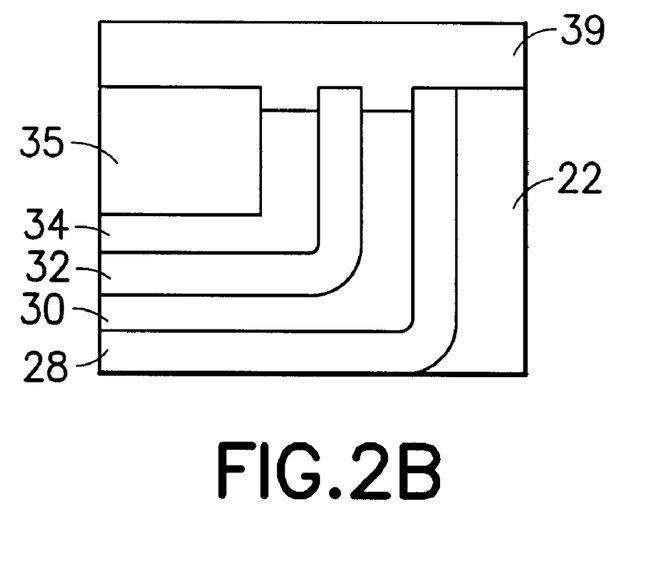

To compensate for such recess structure, and to minimize the edge effects and deleterious phenomena accompanying such conformation of the electrode layers in the subsequent use of the microelectronic device, an insulating layer 39 may be deposited over the device structure, as shown in FIG. 2B. An insulating layer such as $TiO_2$ or $Ta_2O_5$ may be used in the case of PZT or SBT dielectrics, respectively, to afford resistance to Pb or Bi diffusion. Standard interlayer dielectric processing and metallization can follow. Recess of the damaged dielectric is an alternative resultant condition of the CMP operation, and can be correspondingly dealt with, by forming an insulative layer over the dielectric material.

In accordance with an additional embodiment of the invention, chemical mechanical polishing is used to pattern conductive lines. The self-inductance of the lines may be increased by embedding them in a high magnetic permeability material. Magnetic permeability is quantitatively complex; the real part $\mu'$ is dispersive (resulting in a phase change for propagating energy) and the imaginary part $\mu''$ is dissipative (resulting in a loss of propagating energy).

Ferrites are quaternary (or higher oxidative state) metal oxide compounds which exhibit a high $\mu'$ and low $\mu''$ over certain frequency ranges thus making them a suitable class of materials for conductive line applications. Their high permeability, low loss characteristics serve to minimize electrical noise and power dissipation while maintaining signal levels in the conductive lines at appropriate levels.

Examples of ferrites with low $\mu''$ in the microwave region include MgMn ferrites ($Mg_xMn_{1-x}Fe_2O_4$) and MgMnAl ferrites ($Mg_xMn_{1-x}Fe_yAl_{2-y}O_4$). The magnetic and electrical resistance properties of thin films of these materials may be further engineered by modifying grain size, Fe content, etc.

Similarly, in order to achieve a line with increased capacitance per unit length, parasitic capacitance may be increased by embedding the transmission line in a material with high permittivity, $\epsilon$.

Candidates for the high $\epsilon$ film include $BaSrTiO_3$, paraelectric materials from the $PbZrTiO_3$ family, $TiO_2$, $Ta_2O_5$, etc.

Figure 3A:
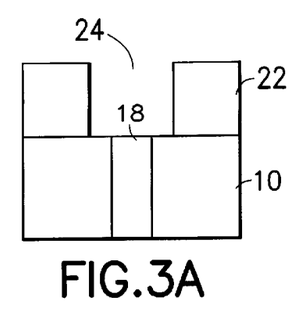
FIGS. 3A–3D show a schematic process flow for patterning sub-micron transmission lines using CMP in accordance with the present invention.

Fabrication of a transmission line with increased inductance (or capacitance) generally will begin with a substrate already containing parts of the integrated circuit, although in principle a network of transmission lines may be formed at any time during fabrication of the integrated circuit device. FIG. 3A shows a substrate 10, with a conductive via 18, which is connected to transistors and other buried circuitry (not shown) already fabricated below the wafer surface. A recess dielectric 22, typically comprising $SiO_2$, $Si_3N_4$ or other suitable insulator material, is deposited by suitable methods well-known to those with ordinary skill in the art. Recesses 24 are opened in the recess dielectric by wet or dry etching. Dry etching is preferred for feature sizes below about 1 micron. The layout of these recesses correspond to the pathways intended for the conductors, and vertical holes may be fabricated in an adjacent lithography-etch step, in order to make contact to conductors or other subsurface structures in the substrate.

Figure 3B:
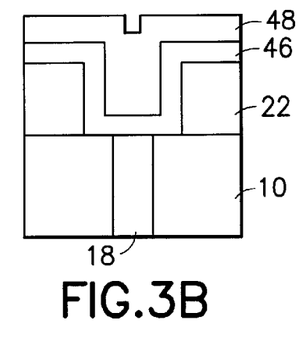

As shown in FIG. 3B, the recesses are filled sequentially by a high permeability layer 46, followed by a conductor 48, using conventional methods for deposition of those layers, such as for example, sputtering, evaporation, CVD, laser ablation, etc. For certain high $\mu$ layer applications, layer 46 may also comprise a barrier layer (not shown) in order to prevent chemical interactions or diffusional interactions with the recess dielectric.

Figure 3C:
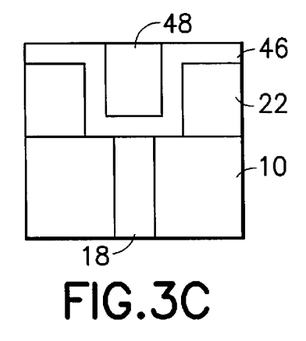
Figure 3D:
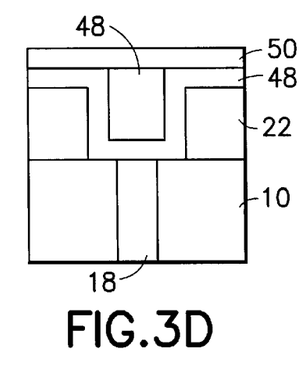

FIG. 3C shows the substrate with these films planarized using CMP, thereby forming the final geometry of the conductor 48. In order to encapsulate the conductor 48 a layer of high $\mu$ material 50 is deposited over the CMP planarized surface, as shown in FIG. 3D.

Depending on the inductance characteristics desired, subsequent metal layers may be formed with or without the inductance-enhancing high $\mu$ layers, by using the same fabrication method described herein.

Higher capacitance structures may also be superimposed in this fabrication scheme by substituting high $\mu$ material for the high $\mu$ thin films.

The present invention may be utilized in any application in which CMP is used to delineate a coordinated formation of conductors and insulators in an integrated circuit.

Resistors may be correspondingly formed, by a damascene process utilizing suitable materials, e.g., Ta or TaN, which have fairly low temperature coefficients of resistance. In general it will be advantageous to form inductors, capacitors and resistors together in an integrated circuit using these techniques.

It will be recognized that the practice of the invention may be widely varied in accordance with the specific teachings herein, to form a wide variety of microelectronic device structures in which planarization and material removal are carried out by CMP and in accordance with the present invention.

Accordingly, while the invention has been described herein with reference to specific aspects, features and embodiments, it will be recognized that the utility of the invention is not thus limited, but rather extends to and encompasses other modifications, variations and other embodiments. Accordingly, the invention is to be correspondingly broadly construed, in respect of the claims hereinafter set forth.

What is claimed is:

1. An integrated circuit structure comprising a conductive pathway recessed in a dielectric substrate, the conductive pathway comprising conductive transmission lines encapsulated in a transmission-enhancement material, wherein the conductive pathway is filled sequentially by a first layer of the transmission-enhancement material followed by the conductive transmission line; a second layer of transmission-enhancement material encapsulating the conductive transmission line and contacting the first layer of the transmission-enhancement material, wherein the transmission-enhancement material is selected from the group consisting of high magnetic permeability materials and high permittivity materials.

2. An integrated circuit structure according to claim 1, wherein said transmission-enhancement material comprises a high magnetic permeability material selected from the group consisting of MgMn ferrites and MgMnAl ferrites.

3. An integrated circuit structure according to claim 1, wherein said transmission-enhancement material comprises a high permittivity material selected from the group consisting of barium strontium titanate, lead zirconium titanate, titanium oxide, and tantalum oxide.

4. An integrated circuit structure according to claim 1, comprising a ferroelectric capacitor.

5. An integrated circuit structure comprising a conductive pathway recessed in a dielectric substrate deposited on an integrated circuit substrate, the conductive pathway comprising conductive transmission lines encapsulated in a transmission-enhancement material, wherein the conductive pathway is filled sequentially by a first layer of the transmission-enhancement material followed by the conductive transmission line; a second layer of transmission-enhancement material encapsulating the conductive transmission line and contacting the first layer of the transmission-enhancement material, wherein the integrated circuit structure comprises a device structure selected from the group consisting of capacitors, inductors and resistors, the transmission-enhancement material comprising a material selected from the group consisting of:

(i) MgMn ferrites;

(ii) MgMnAl ferrites;

(iii) barium strontium titanate;

(iv) lead zirconium titanate;

(v) titanium oxide; and (vi) tantalum oxide.

6. An integrated circuit structure according to claim 5, comprising a ferroelectric capacitor.

7. An integrated circuit structure according to claim 6, wherein the ferroelectric capacitor has a feature size between 0.06 and 1.0 μm.

8. An integrated circuit structure according to claim 6, wherein the ferroelectric capacitor has a feature size below 0.35 μm.

9. An integrated circuit structure according to claim 6, wherein the ferroelectric capacitor has a feature size between 0.10 and 0.20 μm.

10. An integrated circuit structure according to claim 5, wherein the conductive transmission lines are formed of a material selected from the group consisting of tungsten, aluminum, copper, and aluminum-copper alloys.

11. An integrated circuit structure according to claim 5, wherein the conductive transmission lines are formed of copper.

12. An integrated circuit structure according to claim 5, wherein the transmission-enhancement material comprises a MgMn ferrite.

13. An integrated circuit structure according to claim 5, wherein the transmission-enhancement material comprises a MgMnAl ferrite.

14. An integrated circuit structure according to claim 5, wherein the transmission-enhancement material comprises barium strontium titanate.

15. An integrated circuit structure according to claim 5, wherein the transmission-enhancement material comprises lead zirconium titanate.

16. An integrated circuit structure according to claim 5, wherein the transmission-enhancement material comprises titanium oxide.

17. An integrated circuit structure according to claim 5, wherein the transmission-enhancement material comprises tantalum oxide.

* * * * *